United States Patent
Rail

(10) Patent No.: US 6,618,728 B1
(45) Date of Patent: *Sep. 9, 2003

(54) MULTI-PROCESS COMPRESSION

(75) Inventor: Peter D. Rail, Plano, TX (US)

(73) Assignee: Electronic Data Systems Corporation, Plano, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/594,561

(22) Filed: Jan. 31, 1996

(51) Int. Cl.[7] .............................................. G06F 17/00
(52) U.S. Cl. ........................ 707/101; 707/200; 382/232
(58) Field of Search ........................ 348/451, 554–556, 348/14; 382/283, 282, 284; 341/51; 707/1–206; 345/202; 379/88.1; 395/114, 888; 704/500–502; 360/1–68; 711/1–221; 325/230

(56) References Cited

U.S. PATENT DOCUMENTS

| | | | | |
|---|---|---|---|---|
| 5,103,295 A | * | 4/1992 | Uwabata et al. ............ | 348/451 |
| 5,497,244 A | * | 3/1996 | Chargin, Jr. et al. .......... | 360/22 |
| 5,592,669 A | * | 1/1997 | Robinson et al. ........... | 707/206 |
| 5,602,870 A | * | 2/1997 | Hailey et al. ................ | 375/230 |
| 5,668,897 A | * | 9/1997 | Stolfo ........................ | 382/283 |
| 5,684,716 A | * | 11/1997 | Freeman ...................... | 348/14 |
| 5,710,562 A | * | 1/1998 | Gormish et al. .............. | 341/51 |
| 5,710,919 A | | 1/1998 | Rail ............................ | 707/101 |
| 6,453,383 B1 | * | 9/2002 | Stoddard et al. ............ | 707/205 |
| 6,470,345 B1 | * | 10/2002 | Doutre et al. ............... | 707/100 |
| 6,513,051 B1 | * | 1/2003 | Bolosky et al. ............. | 707/204 |

OTHER PUBLICATIONS

Factor et al., Software compression in the client/server environment, Data Compression Conference, 2001, Proceedings, DCC 2001, pp. 233–242.*

Kawashima et al., A universal compressed data format for foreign file systems, Data Compression Conference, 1995, DCC '95, Proceedings, Mar. 28–30, 1995, p. 429.*

Eck et al., A new compression scheme for syntactically structured messages (programs) and its application to Java and the Internet, Data Compression Conference, 1988, DCC '98, Proceedings, Mar. 30—Apr. 1, 1998, p. 542.*

* cited by examiner

Primary Examiner—David Jung
(74) Attorney, Agent, or Firm—Baker Botts LLP

(57) ABSTRACT

A system (10) compresses a file (12) to produce a compressed file (14). The system (10) includes a compression splitter (16) that splits the file (12) into subfiles. Compressors (20a, 20b, 20c), operating on one or more microprocessors, compress the subfiles to produce compressed subfiles (22a, 22b, 22c). A compression combiner (26) combines the compressed subfiles (22a, 22b, 22c) to produce the compressed file (14).

32 Claims, 7 Drawing Sheets

MULTI-PROCESS COMPRESSION

TECHNICAL FIELD OF THE INVENTION

This invention relates in general to the field of data processing, and more specifically to multi-process compression.

BACKGROUND OF THE INVENTION

Computers manipulate or process information. The information used by computers is often stored in files of various formats and sizes. Computers may compress information stored in these files to conserve storage resources. For example, computers running in a DOS or MS-WINDOWS environment may utilize a compression program such as PKZIP.

Computers that perform data processing on large amounts of information may benefit from the reduced file storage requirements as well as the increased processing efficiency offered by file compression. However, existing compression techniques may not take advantage of the processing resources offered by more powerful computers. For example, existing compression techniques do not exploit the distributed processing capability of multi-process computers.

SUMMARY OF THE INVENTION

In accordance with the present invention, the disadvantages and problems associated with compression on multi-process computers has been substantially reduced or eliminated.

In accordance with one embodiment of the present invention, a system for compressing a file includes a splitter that splits the file into subfiles. Compressors are coupled to the splitter, and each compressor compresses one of the subfiles to produce a compressed subfile. A combiner is coupled to the compressors and combines the compressed subfiles produced by the compressors to produce a compressed file.

In accordance with another embodiment of the present invention, a method for compressing a file incudes: splitting the file into subfiles; compressing the subfiles to produce compressed subfiles; and combining the compressed subfiles to produce a compressed file.

Important technical advantages of the present invention include a compression technique that takes advantage of multi-process computers. This is accomplished by splitting the task of compressing a file into smaller tasks performed by separate compressors. In one embodiment, each compressor is a separate software process that receives and compresses a subfile. In another embodiment, the compressors may run on separate microprocessors. By splitting up the compression task to two or more subtasks, the present invention exploits the distributed processing capabilities of multi-process computers.

Other important technical advantages of the present invention include a particular multi-process compression technique for records-based files. Still another important technical advantage of the present invention includes storing, accessing, and modifying compression information that may be associated with a file to indicate parameters used for compression and decompression. Other important technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
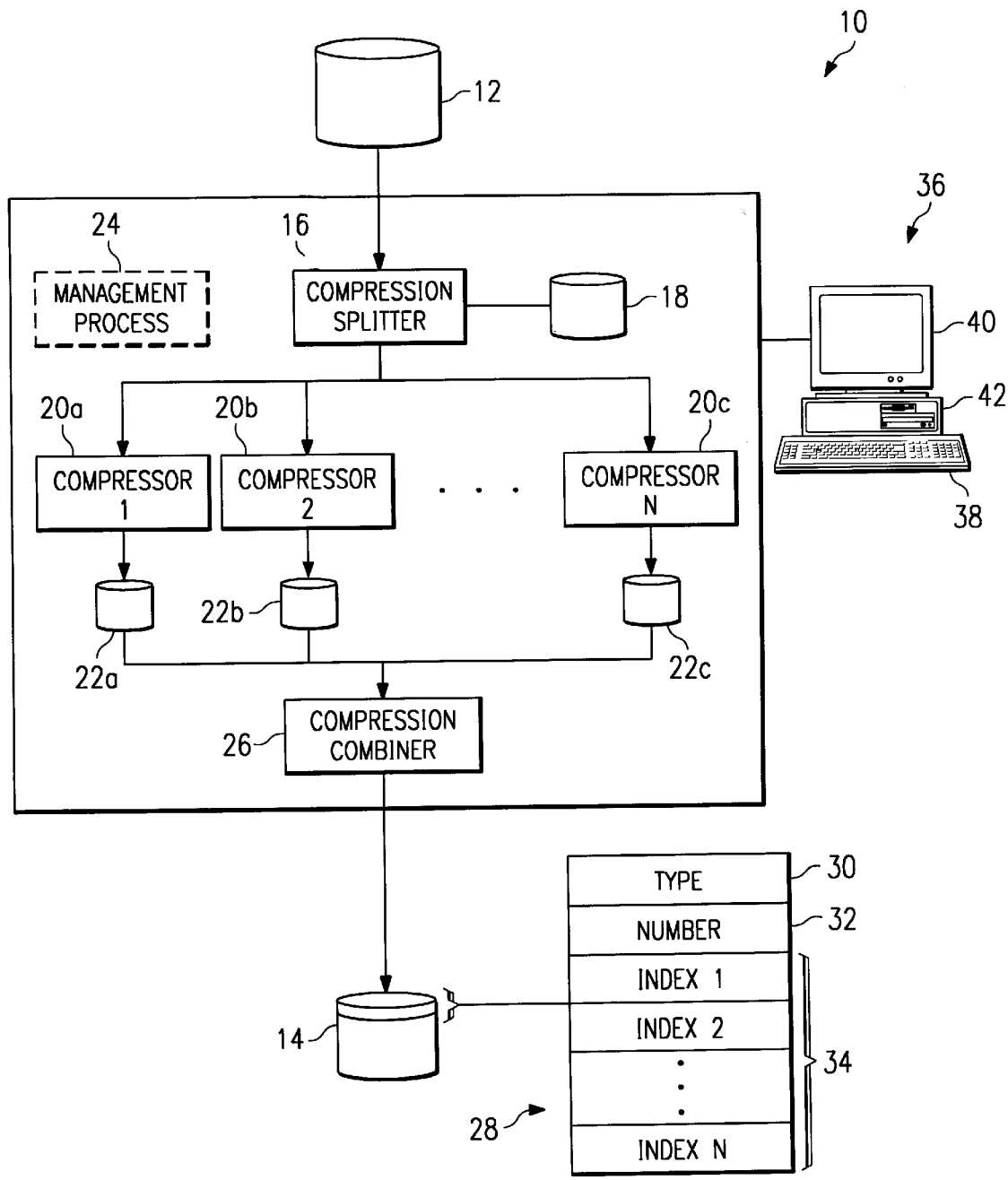
FIG. 1 illustrates a system for compressing a file.

FIG. 1 illustrates a system 10 for compressing a file 12 to produce a compressed file 14. File 12 stores information in memory, such as on magnetic media, CD-ROM, optical, or other volatile or non-volatile storage media. Compressed file 14 stores information represented by file 12 after compression in a similar manner.

File 12 is coupled to a compression splitter 16, which splits file 12 into two or more subfiles for compression. Compression splitter 16 may generate offsets, partitions, pointers, indices or other information to specify the beginning and ending locations of each subfile in file 12. In one embodiment, compression splitter 16 does not physically split file 12, but instead generates beginning and ending location information for subfiles. To accomplish the task of splitting file 12, compression splitter 16 may access compression information stored in a configuration file 18. Compression information maintained in configuration file 18 may include file designations, subfile size targets, subfile size limits, maximum number of compressor designations, maximum number of microprocessor designations, type of compression algorithm, and other information that allows system 10 to compress file 12.

Compression splitter 16 is coupled to compressors 20a, 20b, and 20c, referred to generally as compressors 20. Although three compressors 20a, 20b, and 20c are shown in FIG. 1, system 10 may include two or more compressors 20 to accomplish file compression. Compressors 20 access offsets, partitions, pointers, indices, or other information that specifies the beginning and ending locations of subfiles designated by compression splitter 16. Compressors 20a, 20b, and 20c compress the associated subfiles to produce compressed subfiles 22a, 22b, and 22c, respectively, referred to generally as compressed subfiles 22. Compressors 20 may perform any suitable compression technique to reduce the storage requirement of compressed subfiles 22. For example, compressors 20 may employ a compression program based on the Lempel/Ziv algorithms like PKZIP, UNIX compress, and others. If file 12 includes records-based information, compressors 20 may employ a records-based compression technique. Generally, compressors 20 may employ any suitable compression technique operating at the bit, byte, character, records, or other level to compress information into a corresponding compressed subfile 22.

Compressors 20 execute on one or more microprocessors in a multi-process computing environment. For example, compressors 20 may execute as separate software processes on a single microprocessor. A UNIX computing environment may support many coexisting processes that share the resources of one or more microprocessors. In another embodiment, compressors 20 may each execute on a separate microprocessor. Generally, multi-process compression refers to any embodiment in which file compression is divided into multiple tasks that execute on one or more microprocessors. Depending on the specific processing architecture, a management process 24 may provide management or oversight functions to coordinate the activities among compressors 20.

A compression combiner 26 is coupled to compressed subfiles 22. Compression combiner 26 combines compressed subfiles 22 to produce compressed file 14. In one embodiment, compression combiner 26 copies or concatenates the contents of compressed subfiles 22 into a contiguous location in memory to produce compressed file 14. In another embodiment, compression combiner 26 relates pointer information, indices, or other suitable file information that indicates compressed subfiles 22 together represent compressed file 14. In the latter embodiment, compression combiner 26 may save time and storage capacity by not duplicating information already contained in compressed subfiles 22.

Compression combiner 26 appends or otherwise associates compression information 28 with compressed file 14. All or a portion of compression information 28 may be copied or derived from information stored in configuration file 18. Compression information 28 may include a type field 30 that indicates the type of compression algorithm used by compressors 20, as well as a number field 32 that indicates the number of compressors 20 used to produce compressed subfiles 22. Compression information 28 may also include indices 34 or other suitable information that specifies the size, location, range, or other feature of compressed subfiles 22. For example, indices 34 may specify the beginning memory location of compressed subfiles 22 stored contiguously as compressed file 14. In general, compression information 28 includes any suitable information that may be used to decompress compressed file 14.

System 10 may operate on one or more computers, shown generally as computer 36. Computer 36 maintains and executes the instructions to implement compression of file 12 in a multi-process computing environment to produce compressed file 14. Computer 36 includes an input device 38 such as a keypad, touch screen, or other device that can accept information. Output device 40 conveys information associated with the operation of system 10, including digital data, visual information, or audio information. Both input device 38 and output device 40 may include fixed or removable storage media, such as magnetic computer disks, optical disks, CD-ROM, or other suitable media to both receive output from and provide input to system 10. One or more processors 42 and their associated memories execute instructions and manipulate information in accordance with the operation of system 10 described below.

Computer 36 may comprise a computing platform, such as a UNIX workstation, which includes a single microprocessor that supports the creation, execution, and management of two or more coexisting compressors 20 running as software processes. Computer 36 may also comprise a computer architecture that includes two or more microprocessors to perform compression of file 12. A symmetric multi-processor (SMP) computer may employ twenty microprocessors or more to execute compressors 20. For example, a Pyramid Nile Class SMP can support up to sixteen microprocessors. A massively parallel processing (MPP) computer may include even more microprocessors to accomplish multi-process compression.

The divide and conquer strategy for file compression illustrated in FIG. 1 provides several technical advantages. By splitting or dividing file 12 into two or more subfiles, the resource-intensive process of file compression may be accomplished in parallel by two or more compressors 20. This multi-process compression technique takes advantage of computers that support coexisting software processes as well as computers having multiple microprocessors. Compression in parallel maximizes the processing resources of multi-process computers and reduces the time for compression of file 12. Furthermore, a multi-process compression technique may be ported between single processor and multiple processor computing-platforms without significant software modification.

Figure 2:
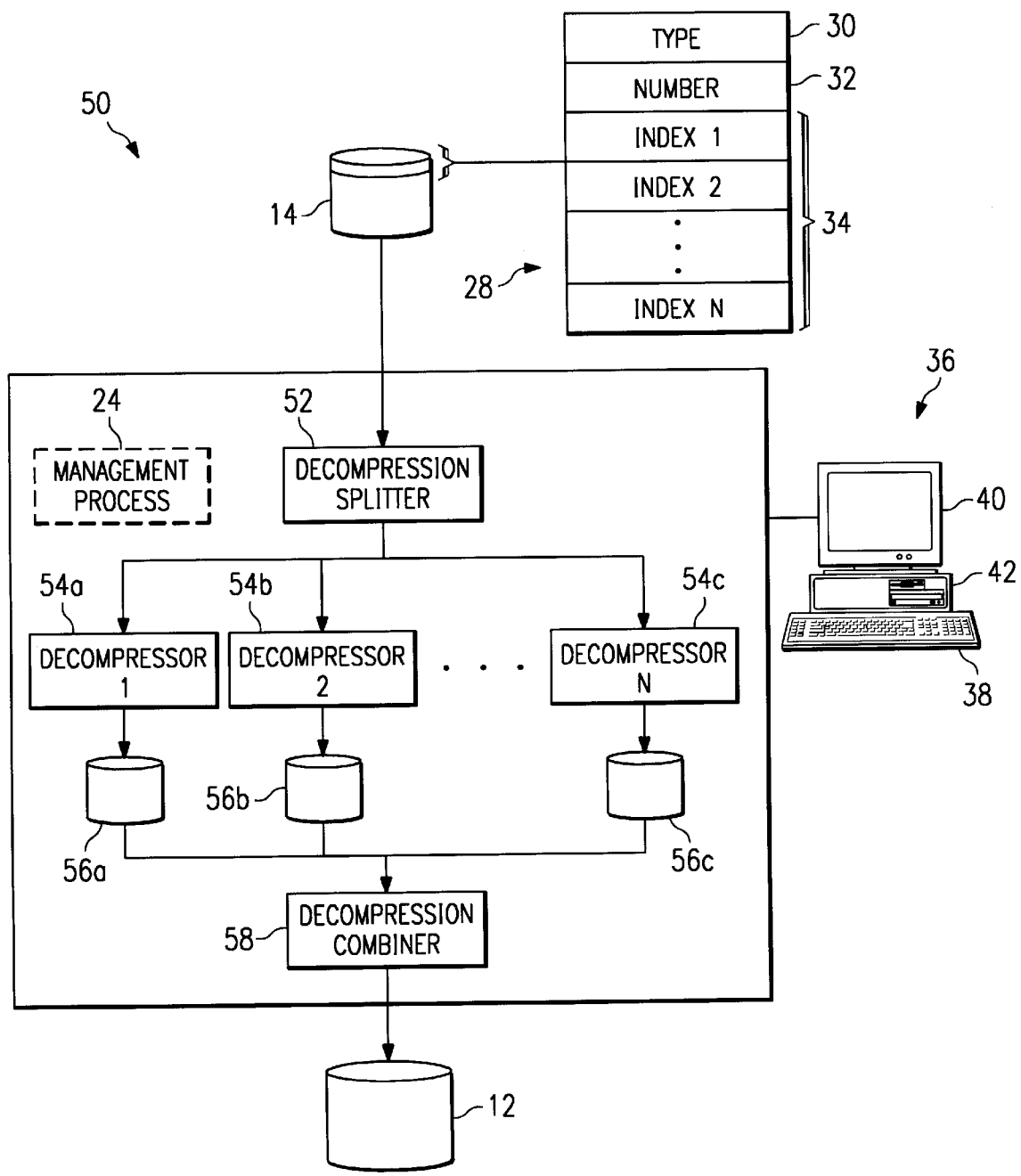
FIG. 2 illustrates a system for decompressing a file.

FIG. 2 illustrates a system 50 for decompressing compressed file 14 to produce file 12. A decompression splitter 52 is coupled to decompressors 54a, 54b, and 54c, referred to generally as decompressors 54. Although three decompressors 54a, 54b, and 54c are shown in FIG. 2, system 50 may include two or more decompressors 54 to accomplish file decompression. Decompression splitter 52 splits compressed file 14 into two or more compressed subfiles using compression information 28. For example, decompression splitter 52 may read number field 32 in compression information 28 and then split compressed file 14 into compressed subfiles using indices 34. Decompression splitter 52 may generate offsets, partitions, pointers, indices or other information, based on or independent of compression information 28, to specify the beginning and ending locations of each compressed subfile in compressed file 14. In one embodiment, decompression splitter 52 does not physically split compressed file 14, but instead generates beginning and ending location information for compressed subfiles. Decompressors 54a, 54b, and 54c compress each associated compressed subfile to produce subfiles 56a, 56b, and 56c, respectively, referred to generally as subfiles 56.

A decompression combiner 58 is coupled to subfiles 56. In one embodiment, decompression combiner 58 copies or concatenates the contents of subfiles 56 into a contiguous location in memory to produce file 12. In another embodiment, decompression combiner 58 relates pointer information, indices, or other suitable file information that indicates subfiles 56 together represent file 12.

Figure 3:
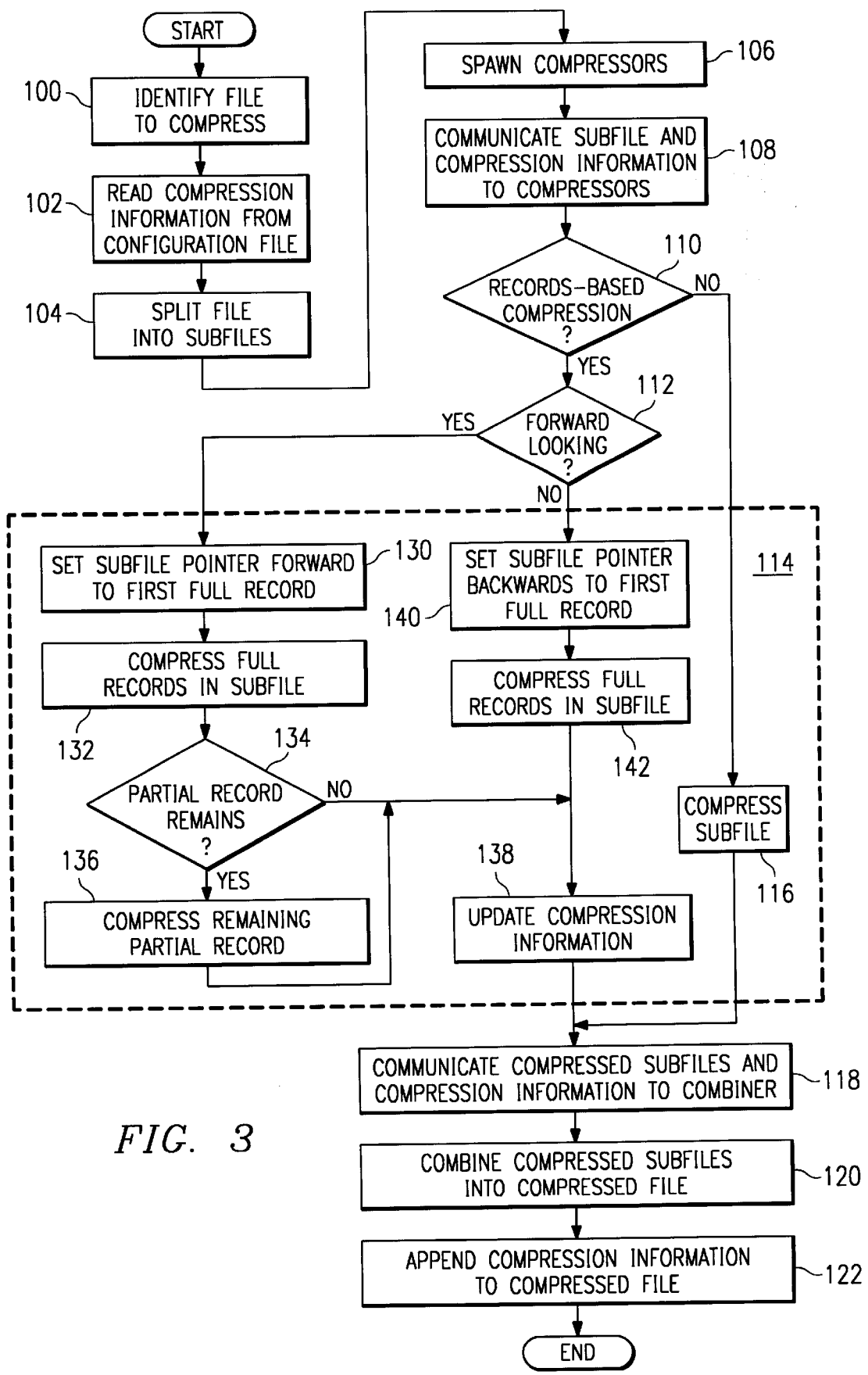
FIG. 3 is a flow chart of a method for compressing a file.

FIG. 3 illustrates a flow chart of a method for compressing file 12 using system 10. The method begins at step 100 where system 10 identifies file 12 to compress. Compression splitter 16 reads compression information from configuration file 18 at step 102. Compression splitter 16 then splits file 12 into subfiles at step 104. The splitting of file 12 may be accomplished by specifying a beginning location, ending location, range, or other suitable information of file 12 that designates portions of file 12 as subfiles. Compression splitter 16 need not physically split file 12 or generate separate subfiles, but may designate portions of file 12 for access by compressors 20.

In one embodiment, system 10 spawns the number of compressors 20 at step 106 needed to compress each subfile identified or designated by compression splitter 16 in step 104. Compression splitter 16 communicates subfile and compression file information to compressors 20 at step 108. For example, in the present UNIX computing environment, compression splitter 16 issues the appropriate number of spawn or "fork" commands that specify subfile and compression information in their parameters to create the number of compressors 20 used for file compression.

System 10 then determines whether compression will proceed by record at step 110, and if so, whether a records-based compression will use a forward-looking technique at step 112. Depending on the decisions at steps 110 and 112, compressors 20 compress their associated subfiles as indicated by the steps contained in dashed box 114. Dashed box 114 illustrates the steps performed by a single compressor 20, but it should be understood that these steps are performed in parallel by any number of compressors 20 employed by system 10.

If system 10 does not perform a records-based compression at step 110, then compressors 20 compress their associated subfiles at step 116 using another appropriate compression technique to produce compressed subfiles 22. Compressors 20 communicate their associated compressed subfiles 22 and any related compression information 28 to compression combiner 26 at step 118. Compression combiner 26 combines compressed subfiles 22 to produce compressed file 14 at step 120. As described above with reference to FIG. 1, this may be accomplished by copying or concatenating the contents of compressed subfiles 22 into a contiguous location in memory, or by relating pointer information, indices, or other suitable file information that indicates compressed subfiles 22 together represent compressed file 14. Compression combiner 26 appends or associates compression information 28 to compressed file 14 to complete the compression process at step 122.

If system 10 performs a records-based compression at step 110 and utilizes a forward-looking technique at step 112, then compressors 20 set a subfile pointer forward to the first full record in their associated subfiles at step 130. A subfile pointer may be any suitable memory locator, specifier, or offset that allows compressors 20 to maintain their current processing location in subfiles. The subfile pointer may be adjusted forwards or backwards to the beginning of a full record by searching for a record separator.

After setting the subfile pointer, compressors 20 compress each full record in their associated subfiles at step 132. If a partial record remains at step 134, then compressors 20 compress the complete record that was only partially included in the original subfile designation at step 136. If no partial record remains at step 134 or after compressing the remaining partial record at step 136, compressors 20 update compression information 28 for their associated compressed subfiles at step 138. For example, compressors 20 may modify information from configuration file 18 to indicate the adjustment of a subfile pointer at step 130, the location of subfile pointer after compression is complete, or any other information relating to the compression process. The method continues at steps 118 through 122, as described above.

If system 10 performs a records-based compression at step 110 but does not use a forward-looking technique at step 112, then compressors 20 set their associated subfile pointer backwards to the first full record at step 140. Compressors 20 then compress the remaining full records in subfiles at step 142. In this embodiment, compressors 20 do not compress partial records at the end of subfiles. Compressors 20 may update compression information at step 138 to indicate, for example, the adjustment of subfile pointer at step 140, the location of subfile pointer after compression is complete, or any other information relating to the compression process. The method continues at steps 118 through 122, as described above.

Figure 4:
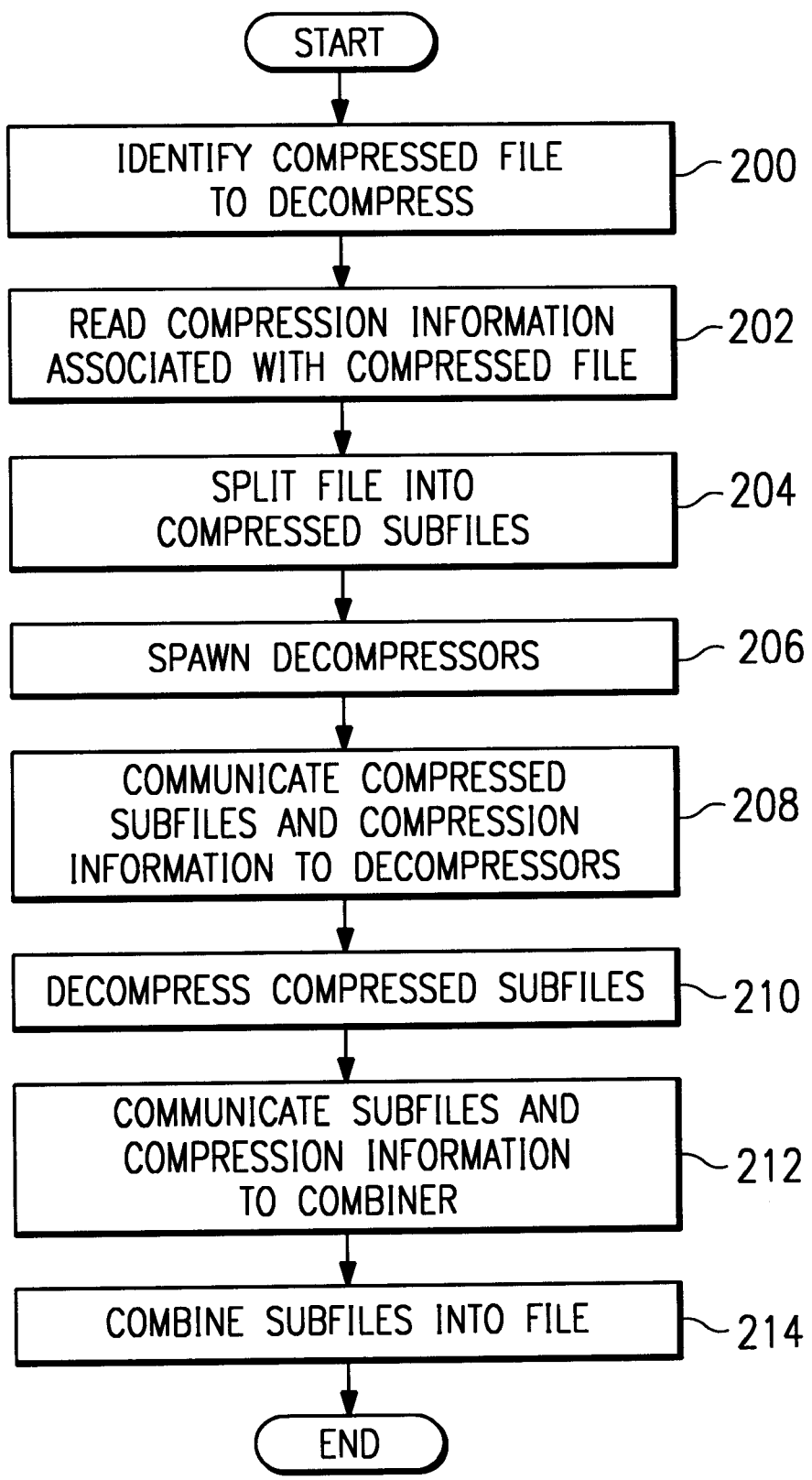
FIG. 4 is a flow chart of a method for decompressing a file.

FIG. 4 illustrates a flow chart of a method for decompressing compressed file 14. The method begins at step 200, where system 50 identifies compressed file 14 to decompress. Decompression splitter 52 reads compression information 28 appended to or associated with compressed file 14 at step 202. Decompression splitter 52 then splits compressed file 14 into compressed subfiles at step 204. The splitting of compressed file 14 may be accomplished by specifying a beginning location, ending location, range, or other suitable information of compressed file 14 that designates portions of compressed file 14 as compressed subfiles. Decompression splitter 52 need not physically split compressed file 14 or generate separate compressed subfiles, but may designate portions of compressed file 14 for access by decompressors 54. In one embodiment, decompression splitter 52 may access pointer information, indices, or other suitable file information generated during the compression process and stored in compression information 28 that designates compressed subfiles 22 that together represent compressed file 14.

In a particular embodiment, system 50 spawns the number of decompressors 54 at step 206 needed to decompress each compressed subfile identified in step 204. The number of decompressors 54 may correspond to number field 32 maintained in compression information 28. In one embodiment, the number of decompressors 54 used in system 50 may be equal to the number of compressors 20 used in system 10. Systems 10 and 50, however, contemplate any number of compressors 20 and decompressors 54, whether the same in number or not, to accomplish file compression and decompression.

Decompression splitter 52 communicates compressed subfiles and any related compression information 28 to decompressors 54 at step 208. Decompressors 54 decompress compressed subfiles in parallel to produce their associated subfiles 56 at step 210. Subfiles 56 and any compression information 28 is communicated to decompression combiner 58 at step 212. Decompression combiner 58 combines subfiles 56 into file 12 at step 214.

Figure 5:
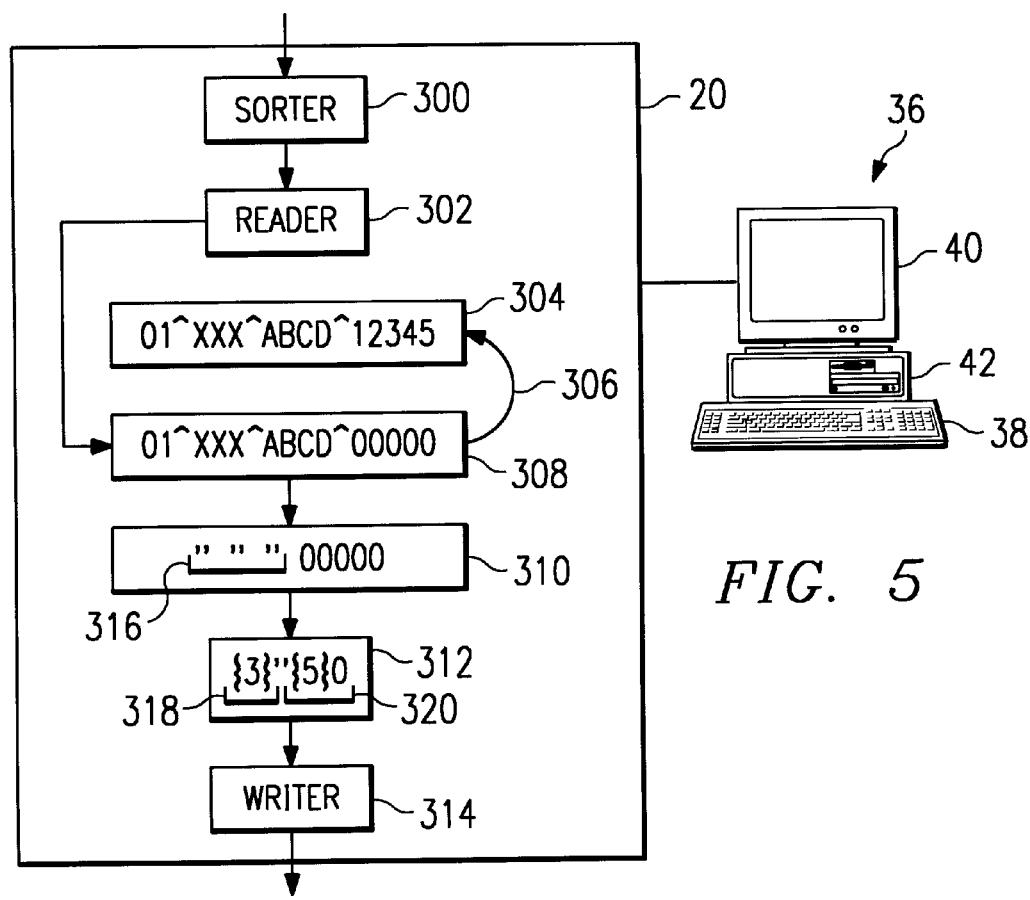
FIG. 5 illustrates a particular embodiment of a records-based compressor.
Figure 6:
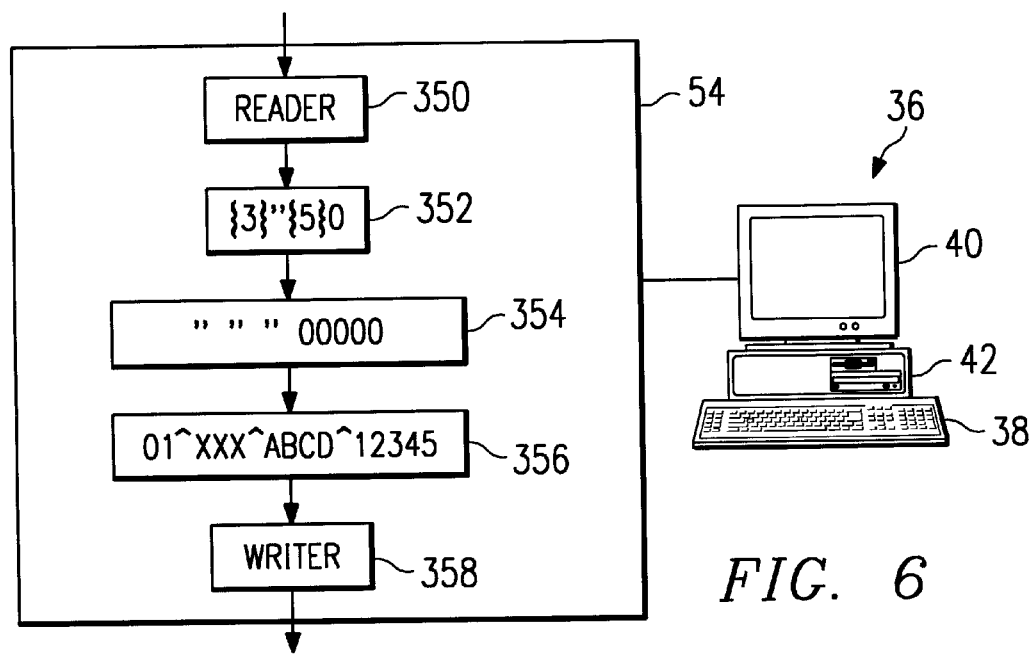
FIG. 6 illustrates a particular embodiment of a records-based decompressor.
Figure 7:
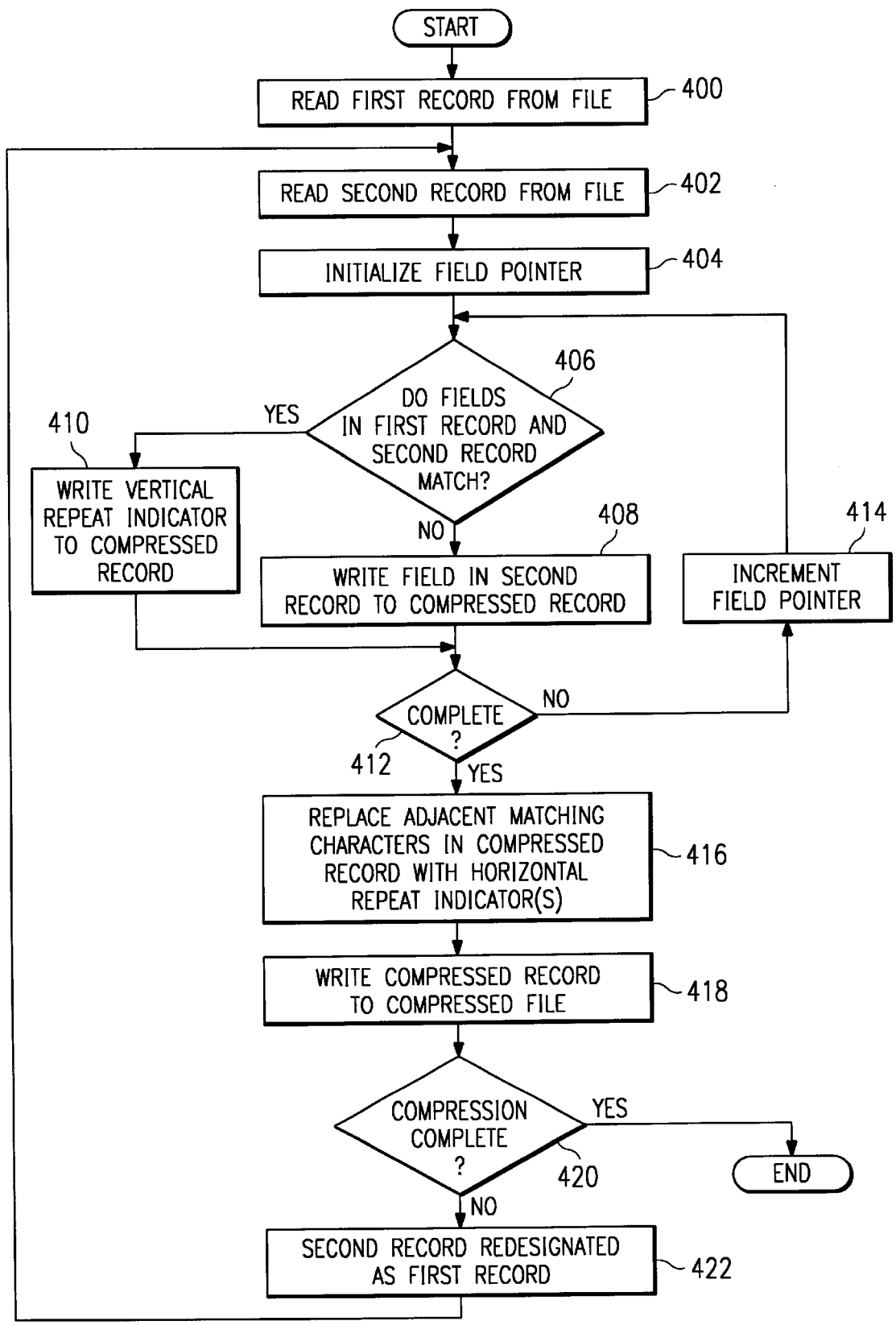
FIG. 7 is a flow chart of a method for compressing a records-based file.
Figure 8:
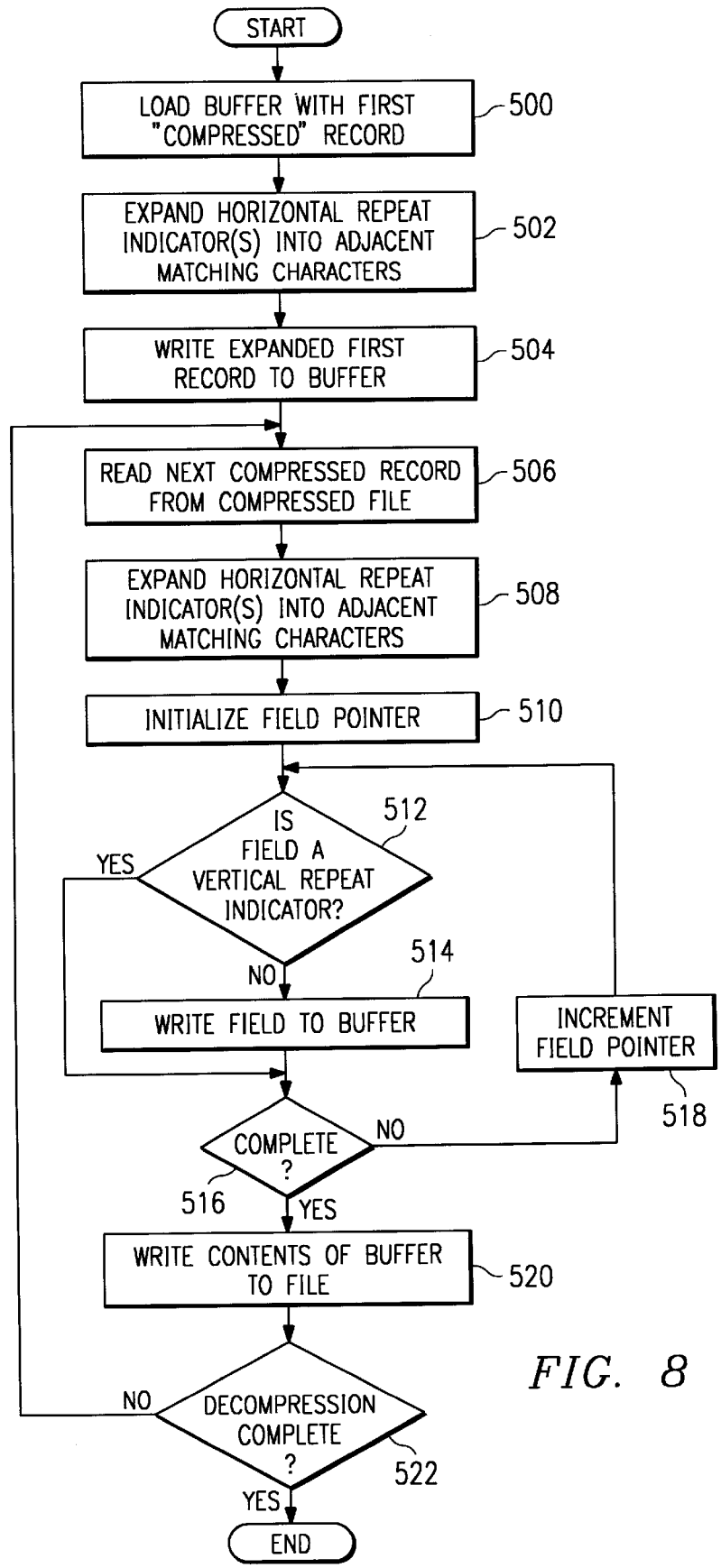
FIG. 8 is a flow chart of a method for decompressing a records-based file.

In a particular embodiment of the present invention, a records-based compression and decompression technique may be used with systems 10 and 50, respectively. FIG. 5 illustrates a particular embodiment of compressor 20 that may be used with system 10, and FIG. 6 illustrates a particular embodiment of decompressor 54 that may be used with system 50. FIG. 7 is a flow chart of a method for compressing a records-based file using compressor 20 of FIG. 5. FIG. 8 is a flow chart of a method for decompressing a records-based file using decompressor 54 of FIG. 6.

FIG. 5 illustrates a compressor 20 for compressing records stored in file 12. Records compressed by compressor 20 may represent any information arranged in delimited format. For example, each record may comprise several variable length fields separated with a comma or other appropriate field separator. Successive records in the file may be separated by a semicolon, end-of-line character, or other appropriate record separator. In one embodiment, information in file 12 may include call detail records that are processed for billing telecommunications services.

File 12 is coupled to sorter 300, which initially sorts delimited records by one or more fields to improve compression effectiveness. For example, if system 10 processes call detail records, sorter 300 may sort records by a connect date field, a calling number field, a called number field, or other field that places similar records adjacent to each other in the file to be compressed. A reader 302 operates to successively read sorted records.

Reader 302 is coupled in sequence to second buffer 308 and first buffer 304, as indicated by arrow 306. The compressed version of the record in second buffer 308 appears in buffer 310 after vertical compression and in buffer 312 after horizontal compression. The vertically and horizontally compressed record is written to compressed file 14 by writer 314. It should be understood that buffers 304, 308, 310, and 312 are illustrated to describe the compression techniques and that one skilled in the art may utilize any suitable collection and arrangement of buffers, registers, or other memory locations or devices to practice the teachings of the present invention.

Compressor 20 may operate on one or more computers, shown generally as computer 36. Computer 36 maintains and executes the instructions to implement sorter 300, reader 302, and writer 314. Computer 36 also maintains and executes instructions to manipulate information in buffers 304, 308, 310, and 312 to perform both vertical and horizontal compression. Computer 36 includes an input device 38, an output device 40, and a processor 42 and its associated memory, as described above with reference to FIG. 1.

In operation, records from file 12 are sorted by sorter 300 and read in succession by reader 302. Each record is transferred from reader 302 to second buffer 308 and then to first buffer 304. A first record is initially stored in second buffer 308 and then transferred to first buffer 304, as indicated by arrow 306. At this point, the compression of the second record stored in second buffer 308 proceeds in two steps: vertical compression and horizontal compression.

Vertical compression compares, on a field-by-field basis, the first record to the second record. If the corresponding fields in the two records match, then a vertical repeat indicator is written to buffer 310. If corresponding fields of the two records do not match, then the field from the second record is written to buffer 310. In the example shown in FIG. 5, the first three fields of both records (01^XXX^ABCD) match. Therefore, the first three fields of the second record are represented in buffer 310 by three successive vertical repeat indicators 316, shown here as three ditto signs. The last field of the first record and the second record do not match, so the last field from the second record (00000) is written to buffer 310.

Horizontal compression further compresses the second record by replacing adjacent matching characters stored in buffer 310 with horizontal repeat indicators stored in buffer 312. This may be accomplished by a run-length encoding (RLE) method or any other suitable method that can effectively compress repeated information in a single record. Horizontal compression not only removes repeated characters within fields, but also removes horizontal runs of vertical repeat indicators. As shown in buffer 312, a first horizontal repeat indicator 318 represents the run of three vertical repeat indicators 316 and a second horizontal repeat indicator 320 represents the run of five zeros in the last field of the second record.

In one embodiment, the horizontal repeat indicator comprises a character and a number indicating the repetitions of the character in the record. A horizontal repeat indicator may be a two-byte representation. The first byte comprises a repeat indicator bit, a bit indicating whether the repeat character is a vertical repeat indicator, and the remaining bits representing the number of repetitions. The second byte designates the repeated character. If the repeat character is a vertical repeat indicator, then the second byte is not needed.

The vertically and horizontally compressed second record stored in buffer 312 is then transferred to compressed file 14 by writer 314. Decompressed second record in second buffer 308 is transferred to first buffer 304, as indicated by arrow 306, and the next record is loaded into second buffer 308 for compression. The process continues until all records from file 12 are compressed and stored in compressed file 14.

The compressed form of records stored in compressed file 14 provides several advantages. File storage space is reduced, which may be critical if compressor 20 imposes a file size restriction, such as the two gigabyte limit imposed by typical UNIX operating environments. For files with similar adjacent records, such as call detail records, the effective compression ratio from file 12 to compressed file 14 may be five-to-one or higher. In addition, compressed file 14 may provide certain advantages in processing records. Some compression techniques may not preserve the record separator in the file after compression. However, vertical and horizontal compression preserves the record separator in the file, which allows a record counting utility to determine the number of records in compressed file 14.

FIG. 6 illustrates decompressor 54 that decompresses records in compressed file 14. The decompression technique performs in reverse order the vertical and horizontal compression described above with reference to FIG. 5. Decompressor 54 comprises a reader 350 that reads in succession records stored in compressed file 14 and transfers the records to buffer 352. The horizontal repeat indicators in the record stored in buffer 352 are first expanded and stored in buffer 354. As each record stored in compressed file 14 is processed serially, buffer 356 contains the decompressed fields of the previous record. Fields in buffer 354 represented by vertical repeat indicator match corresponding fields in buffer 356, and these portions of buffer 356 need not be modified. Fields in buffer 354 not represented by vertical repeat indicators are written to buffer 356 to reproduce the decompressed record. Writer 358 writes the decompressed record stored in buffer 356 to file 12, and the next record in sequence is processed.

FIG. 7 is a flow chart of a method for a records-based compression technique using compressor 20 of FIG. 5. The method begins at step 400 where a first record is read from file 12 and loaded into first buffer 304. A second record from file 12 is read and loaded into second buffer 308 at step 402. A field pointer is then initialized before vertical compression at step 404.

For each field in the second record, vertical compression compares the field in the second record to the corresponding field in the first record at step 406. If the fields in the first record and the second record do not match, then the field from the second record is written to the compressed record stored in buffer 310 at step 408. If the fields in the first record and the second record match, then a vertical repeat indicator is written to the compressed record stored in buffer 310 at step 410. If the vertical compression process is not complete at step 412, then the field pointer is incremented at step 414 and the next field of the second record is processed at step 406.

After vertical compression is complete at step 412, adjacent matching characters in the compressed record stored in buffer 310 are replaced with a horizontal repeat indicator at step 416. Writer 314 writes the compressed record stored in buffer 312, after both vertical and horizontal compression, to compressed file 14 at step 418.

If compression of file 12 is not complete at step 420, serial processing of records in file 12 continues. The second record in second buffer 308 is transferred to first buffer 304, as indicated by arrow 306, and redesignated as the first record at step 422. The process continues by loading a new second record in second buffer 308 at step 402. By maintaining a decompressed copy of the previously processed record in first buffer 304, the method of FIG. 7 serially compresses records from file 12 with reduced storage and processing requirements.

FIG. 8 is a flow chart of a method for decompressing a records-based file using decompressor 54 of FIG. 6. The method begins at step 500 where reader 350 reads a first record from compressed file 14 and loads the first record into buffer 352. If compressed file 14 was generated using the compression technique of FIG. 7, the first record in compressed file 14 does not contain vertical repeat indicators. One or more horizontal repeat indicators in the first record are expanded into adjacent matching characters at step 502, and the fully expanded first record is written to buffer 356 at step 504.

Reader 350 reads the next compressed record in compressed file 14 and loads the next compressed record into buffer 352 at step 506. The horizontal repeat indicators in the compressed record are expanded into adjacent matching characters at step 508 and stored in buffer 354. A field pointer is initialized before vertical decompression at step 510.

If the field in buffer 354 is not a vertical repeat indicator at step 512, then the field is written to the decompressed record stored in buffer 356 at step 514. If the field in buffer 354 is a vertical repeat indicator, then writing step 514 is bypassed and the corresponding field stored in buffer 356 from the previously decompressed record remains unchanged. Therefore, since buffer 356 initially contains the previously decompressed record, only those portions of compressed record stored in buffer 354 that vary from the previous record need to be modified in buffer 356. This operation streamlines decompression processing by reducing the number of writes to buffer 356 and by eliminating another buffer to store the previous decompressed record.

If vertical decompression is not complete at step 516, then field pointer is incremented at step 518 and the next field processed at step 512. If vertical decompression is complete, then writer 358 writes the contents of buffer 356 to file 12 at step 520. If decompression of compressed file 14 is not complete at step 522, the serial decompression process continues by reading the next compressed record from compressed file 14 into buffer 352 at step 506.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A system for compressing a file having a plurality of records, the system comprising:
a splitter operable to partition the file into a first subfile and a second subfile, wherein each subfile comprises a subset of the records contained in the file;
a first compressor coupled to the splitter and operable to compress the first subfile to produce a first compressed subfile;
a second compressor coupled to the splitter and operable to compress the second subfile to produce a second compressed subfile; and
a combiner coupled to the compressors, the combiner operable to combine the compressed subfiles produced by the compressors to produce a compressed file.

2. The system of claim 1, further comprising a first microprocessor and a second microprocessor, wherein the first compressor executes on the first microprocessor and the second compressor executes on the second microprocessor.

3. The system of claim 1, wherein each compressor comprises a separate software process.

4. The system of claim 1, wherein the splitter is further operable to generate a subfile pointer for each subfile to specify the first record of the subfile.

5. The system of claim 1, wherein each compressor is further operable to set a subfile pointer forward to the beginning of a first record for an associated subfile, and further operable to compress a last record in the subfile if the associated subfile comprises at least a portion of the last record.

6. The system of claim 1, wherein each compressor is further operable to set a subfile pointer backwards to the beginning of a first record for an associated subfile, and further operable to compress a last record in the subfile that comprises a complete record.

7. A method performed on a computer for compressing a file having a plurality of records, the method comprising:
partitioning the file into a first subfile and a second subfile, wherein each subfile comprises a subset of the records contained in the file;
compressing the first subfile to produce a first compressed subfile;
compressing the second subfile to produce a second compressed subfile; and
combining the compressed subfiles to produce a compressed file.

8. The method of claim 7, wherein the steps of compressing the subfiles comprise:
providing a first compressor and a second compressor;
compressing the first subfile using the first compressor; and
compressing the second subfile using the second compressor.

9. The method of claim 7, wherein the steps of compressing the subfiles comprise:
spawning a first compressor and a second compressor as separate software processes;
compressing the first subfile using the first compressor; and
compressing the second subfile using the second compressor.

10. The method of claim 7, wherein the steps of compressing the subfiles further comprise:
setting a subfile pointer forward to the beginning of a first record for each subfile; and
compressing a last record in each subfile if the associated subfile comprises at least a portion of the last record.

11. The method of claim 7, wherein the steps of compressing the subfiles further comprise:
setting a subfile pointer backwards to the beginning of a first record for each subfile; and
compressing a last record in each subfile that comprises a complete record.

12. A compressor for compressing a file having a plurality of records with delimited fields, the compressor comprising:
a first buffer operable to store a first record of the file;
a second buffer operable to store a second record of the file; and
a processor coupled to the first buffer and the second buffer, the processor operable to compare, on a field-by-field basis, the first record to the second record, the processor operable to replace a field of the second record with a vertical repeat indicator if the field of the second record matches the corresponding field of the first record.

13. The compressor of claim 12, wherein the first record and the second record comprise adjacent records contained in the file.

14. The compressor of claim 12, wherein the processor is further operable to compare a first field of the second record with a second field of the second record, and to replace the first field with a horizontal repeat indicator if the first field matches the second field.

15. The compressor of claim 14, wherein the horizontal repeat indicator comprises:

the vertical repeat indicator; and a number indicating the repetitions of the vertical repeat indicator.

16. The compressor of claim 12, wherein the processor is further operable to compare a first character of a field of the second record with a second character of the field, and to replace the first character with a horizontal repeat indicator if the first character matches the second character.

17. The compressor of claim 16, wherein the horizontal repeat indicator comprises:

the character; and a number indicating the repetitions of the character.

18. The compressor of claim 12, wherein:

the file comprises a plurality of subfiles, each subfile comprising a subset of the records contained in the file; and the processor is further operable to set a subfile pointer forward to the beginning of the first record for each subfile, and to compress a last record in each subfile if the associated subfile comprises at least a portion of the last record.

19. The compressor of claim 12, wherein:

the file comprises a plurality of subfiles, each subfile comprising a subset of the records contained in the file; and the processor is further operable to set a subfile pointer backwards to the beginning of a first record for each subfile, and to compress a last record in each subfile that comprises a complete record.

20. A method for compressing a file having a plurality of records with delimited fields, the method comprising:

comparing, on a field-by-field basis, a first record of the file to a second record of the file; and replacing a field of the second record with a vertical repeat indicator if the field of the second record matches the corresponding field of the first record.

21. The method of claim 20, wherein the first record and the second record comprise adjacent records contained in the file.

22. The method of claim 20, further comprising the steps of:

comparing a first field of the second record with a second field of the second record; and replacing the first field with a horizontal repeat indicator if the first field matches the second field.

23. The method of claim 22, wherein the horizontal repeat indicator comprises:

the vertical repeat indicator; and a number indicating the repetitions of the vertical repeat indicator.

24. The method of claim 20, further comprising the steps of:

comparing a first character of a field of the second record with a second character of the field; and replacing the first character with a horizontal repeat indicator if the first character matches the second character.

25. The method of claim 24, wherein the horizontal repeat indicator comprises:

a character; and a number indicating the repetitions of the character.

26. The method of claim 20, wherein the file comprises a plurality of subfiles, each subfile comprising a subset of the records contained in the file, and further comprising the steps of:

setting a subfile pointer forward to the beginning of a first record for each subfile; and compressing a last record in each subfile if the associated subfile comprises at least a portion of the last record.

27. The method of claim 20 wherein the file comprises a plurality of subfiles, each subfile comprising a subset of the records contained in the file, and further comprising the steps of:

setting a subfile pointer backwards to the beginning of a first record for each subfile; and compressing a last record in each subfile that comprises a complete record.

28. A method for decompressing a compressed file having a plurality of records with delimited fields, the method comprising:

determining, on a field-by-field basis, if a field of a compressed record comprises a vertical repeat indicator; and writing the field to a buffer if the field of the compressed record is not a vertical repeat indicator.

29. The method of claim 28, further comprising writing a corresponding field of a previous decompressed record to the buffer if the field of the compressed record is a vertical repeat indicator.

30. The method of claim 29, wherein the decompressed record and the compressed record comprise adjacent records of the file.

31. The method of claim 28, further comprising:

determining, on a field-by-field basis, if a field of the compressed record comprises a horizontal repeat indicator having a character and a number indicating the repetitions of the character; and writing to a second buffer the character of the horizontal repeat indicator according to the number indicating the repetitions of the character.

32. The method of claim 31, wherein the character of the horizontal repeat indicator comprises the vertical repeat indicator.

* * * * *